(12) United States Patent
Kim

(10) Patent No.: US 8,507,980 B2
(45) Date of Patent: Aug. 13, 2013

(54) SEMICONDUCTOR DEVICES HAVING BIT LINE INTERCONNECTIONS WITH INCREASED WIDTH AND REDUCED DISTANCE FROM CORRESPONDING BIT LINE CONTACTS AND METHODS OF FABRICATING SUCH DEVICES

(75) Inventor: Dae-Ik Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/195,274

(22) Filed: Aug. 1, 2011

(65) Prior Publication Data

US 2011/0278668 A1    Nov. 17, 2011

Related U.S. Application Data

(63) Continuation of application No. 12/962,772, filed on Dec. 8, 2010, now abandoned.

(30) Foreign Application Priority Data

Feb. 9, 2010    (KR) ........................ 10-2010-0011974

(51) Int. Cl.
*H01L 29/66*    (2006.01)
(52) U.S. Cl.
USPC ............. 257/334; 257/E29.262; 257/E21.657
(58) Field of Classification Search
USPC ............... 257/334, E21.41, E21.19, E21.645, 257/E29.262
See application file for complete search history.

(56) References Cited

U.S. PATENT DOCUMENTS

| | | | |
|---|---|---|---|
| 5,250,457 A | 10/1993 | Dennison | |
| 2007/0281461 A1* | 12/2007 | Jang | 438/622 |
| 2008/0096377 A1* | 4/2008 | Kwak et al. | 438/597 |
| 2010/0127398 A1* | 5/2010 | Kim et al. | 257/773 |
| 2010/0181623 A1 | 7/2010 | Im et al. | |
| 2011/0065275 A1 | 3/2011 | Kim et al. | |

FOREIGN PATENT DOCUMENTS

| | | |
|---|---|---|
| KR | 10 2001 0028057 A | 4/2001 |
| KR | 10 2006 0010934 A | 2/2006 |
| KR | 10 2007 0082629 A | 8/2007 |

\* cited by examiner

*Primary Examiner* — William D Coleman
*Assistant Examiner* — Christine Enad
(74) *Attorney, Agent, or Firm* — Myers Bigel Sibley & Sajovec

(57) ABSTRACT

A semiconductor device has a bit line interconnection with a greater width and a reduced level on a bit line contact is provided, as are methods of fabricating such devices. These method includes forming a buried gate electrode to intersect an active region of a substrate. Source and drain regions are formed in the active region. A first conductive pattern is formed on the substrate. The first conductive pattern has a first conductive layer hole configured to expose the drain region. A second conductive pattern is formed in the first conductive layer hole to contact the drain region. A top surface of the second conductive pattern is at a lower level than a top surface of the first conductive pattern. A third conductive layer and a bit line capping layer are formed on the first conductive pattern and the second conductive pattern and patterned to form a third conductive pattern and a bit line capping pattern. The second conductive pattern, the third conductive pattern, and the bit line capping pattern, which are sequentially stacked on the drain region, constitute first bit line structures, and the first conductive pattern, the third conductive pattern, and the bit line capping pattern, which are sequentially stacked on the isolation region, constitute second bit line structures.

18 Claims, 21 Drawing Sheets

SEMICONDUCTOR DEVICES HAVING BIT LINE INTERCONNECTIONS WITH INCREASED WIDTH AND REDUCED DISTANCE FROM CORRESPONDING BIT LINE CONTACTS AND METHODS OF FABRICATING SUCH DEVICES

CROSS-REFERENCE TO RELATED APPLICATIONS

This application claims priority under 35 U.S.C. §120 as a continuation application of U.S. patent application Ser. No. 12/962,772, filed Dec. 8, 2010, now abandoned which in turn claims priority under 35 U.S.C. §119 to Korean Patent Application No. 10-2010-0011974, filed on Feb. 9, 2010. The disclosure of each of the above applications is hereby incorporated by reference herein in its entirety.

BACKGROUND

Embodiments of the inventive concept relate to semiconductor devices that include bit lines having a tab-structure and methods of fabricating such devices.

As the integration density of semiconductor devices increases, the horizontal interval between adjacent metal interconnections that are formed in the same plane is reduced. The reduction in this horizontal interval between the adjacent metal interconnections may lead to an increase in parasitic capacitance between metal interconnections that are electrically isolated from each other by, for example, an insulating layer.

SUMMARY

Embodiments of the inventive concept provide semiconductor devices in which a bit line interconnection that forms a contact with a drain region may have a greater width than a bit line interconnection that does not form a contact with the drain region, and methods of fabricating such semiconductor devices.

Also, embodiments of the inventive concept provide semiconductor devices in which a bit line interconnection that forms a contact with a drain region may be at a lower level than a bit line interconnection that does not form a contact with the drain region.

The technical objectives of the inventive disclosure are not limited to the above; other objectives may become apparent to those of ordinary skill in the art based on the following descriptions.

In accordance with an aspect of the inventive concept, a method of fabricating a semiconductor device includes forming an isolation region in a substrate to define an active region. A buried gate electrode is formed that intersects the active region. Source and drain regions are formed in the active region. A first conductive pattern is formed on a top surface of the substrate. The first conductive pattern has a first conductive layer hole that exposes the drain region. A second conductive pattern is formed in the first conductive layer hole to contact the drain region such that a top surface of the second conductive pattern is closer to a bottom surface of the substrate than is a top surface of the first conductive pattern. A third conductive layer and a bit line capping layer are formed on the first conductive pattern and the second conductive pattern and patterned to form a third conductive pattern and a bit line capping pattern. The second conductive pattern, the third conductive pattern, and the bit line capping pattern, which are sequentially stacked on the drain region, constitute first bit line structures. Also, the first conductive pattern, the third conductive pattern, and the bit line capping pattern, which are sequentially stacked on the isolation region, constitute second bit line structures.

In accordance with another aspect of the inventive concept, a method of fabricating a semiconductor device includes forming an isolation region to define an active region in a substrate. A gate electrode is formed in a first direction of the substrate. The gate electrode intersects the active region at a predetermined angle. Source and drain regions are formed in the active region. A first conductive layer and a first mask layer are formed on the substrate. The first conductive layer and the first mask layer are selectively removed to form a first mask pattern and a first conductive pattern having holes exposing the drain region. The first mask pattern and the first conductive pattern are formed to cover the source region and the isolation region. A second conductive pattern is formed that fills only portions of the holes of the first conductive pattern. A third conductive layer and a second mask layer are formed on the first and second conductive patterns. The third conductive layer and the second mask layer are patterned to form a first bit line structure on the drain region and a second bit line structure on the isolation region. The first and second bit line structures constitute a bit line that extends in a second direction of the substrate.

In accordance with still another aspect of the inventive concept, a method of fabricating a semiconductor device includes forming a word line that intersects an active region in a substrate at an oblique angle. A first conductive layer and a first mask layer are formed on the substrate and patterned to form a first mask pattern having a first mask layer hole and a first conductive pattern having a first conductive layer hole that expose a portion of the active region. The first mask layer hole may have substantially the same diameter as the first conductive layer hole. The first mask pattern is patterned to expose a portion of the first conductive layer. Thus, a first mask expansion hole having a greater diameter than the first conductive layer hole is formed. A second conductive layer is formed in the first conductive layer hole. A portion of the second conductive layer and a portion of the first conductive pattern exposed by the first mask expansion hole are removed until a top surface of the second conductive pattern is at the same height above a bottom surface of the substrate as is a top surface of a portion of the first conductive pattern that remains in the first mask expansion hole and at a lower level than a top surface of the unexposed portion of the first conductive pattern. The first mask pattern is removed, and a third conductive layer is formed on the first and second conductive patterns.

In accordance with yet another aspect of the inventive concept, a method of fabricating a semiconductor device includes forming an isolation region on a substrate including a cell area and a peripheral area to define an active region. A buried gate electrode is formed in the substrate of the cell area to intersect the active region. Source and drain regions are formed in the active region of the cell area. A first conductive layer and a first mask layer are formed in both the cell area and the peripheral area. The first conductive layer and the first mask layer are patterned in the cell area to form a first mask pattern and a first conductive pattern having holes exposing the drain region. A second conductive layer is formed to fill the holes of the first mask pattern and the first conductive pattern, and a portion of the second conductive layer is selectively removed to form a second conductive pattern at a lower level than the first conductive pattern. The first mask pattern is removed, and a third conductive layer and a second mask layer are formed on the first and second conductive patterns. The third conductive layer and the second mask layer are patterned in the cell area and the peripheral area. Thus, a second conductive pattern, a third conductive pattern, and a second mask pattern are formed on the active region of the cell area, a first conductive pattern, the third conductive pattern, and the second mask pattern are formed on the isolation region of the cell area, and a peripheral first conductive pattern, a peripheral third conductive pattern, and a peripheral second mask pattern are formed on the active region of the peripheral area.

In accordance with yet another aspect of the inventive concept, a semiconductor device includes a substrate wherein a plurality of active regions are defined by an isolation region and isolated from one another. A first bit line structure includes a second conductive pattern, a third conductive pattern, and a mask pattern sequentially stacked on the active regions. A second bit line structure includes a first conductive layer, the third conductive pattern, and the mask pattern sequentially stacked on the isolation region. The third conductive pattern of the first bit line structure has a tab structure with a greater width than the third conductive pattern of the second bit line structure.

Particulars of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
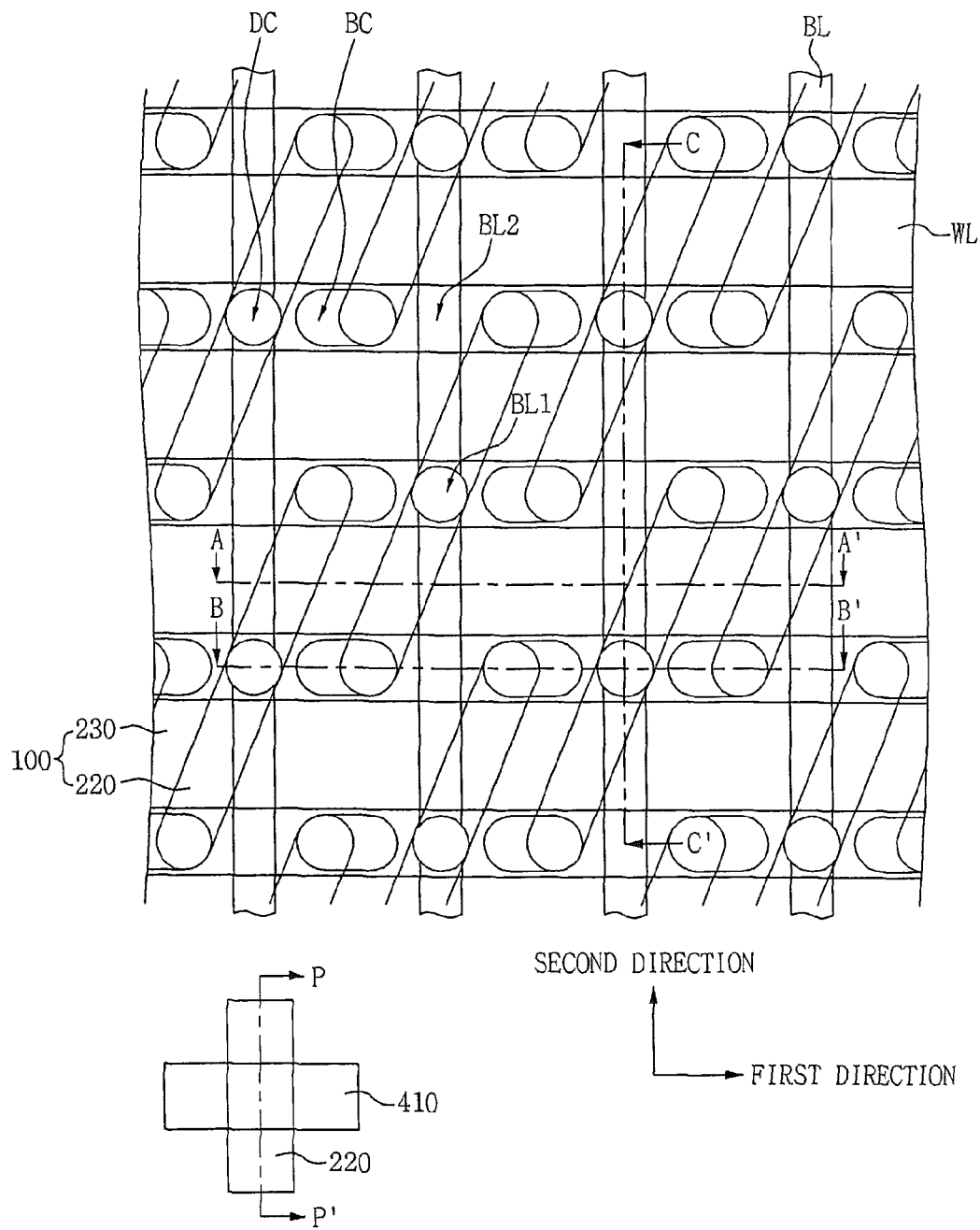
FIG. 1 is a plan view of a semiconductor device according to embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "top," "bottom," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
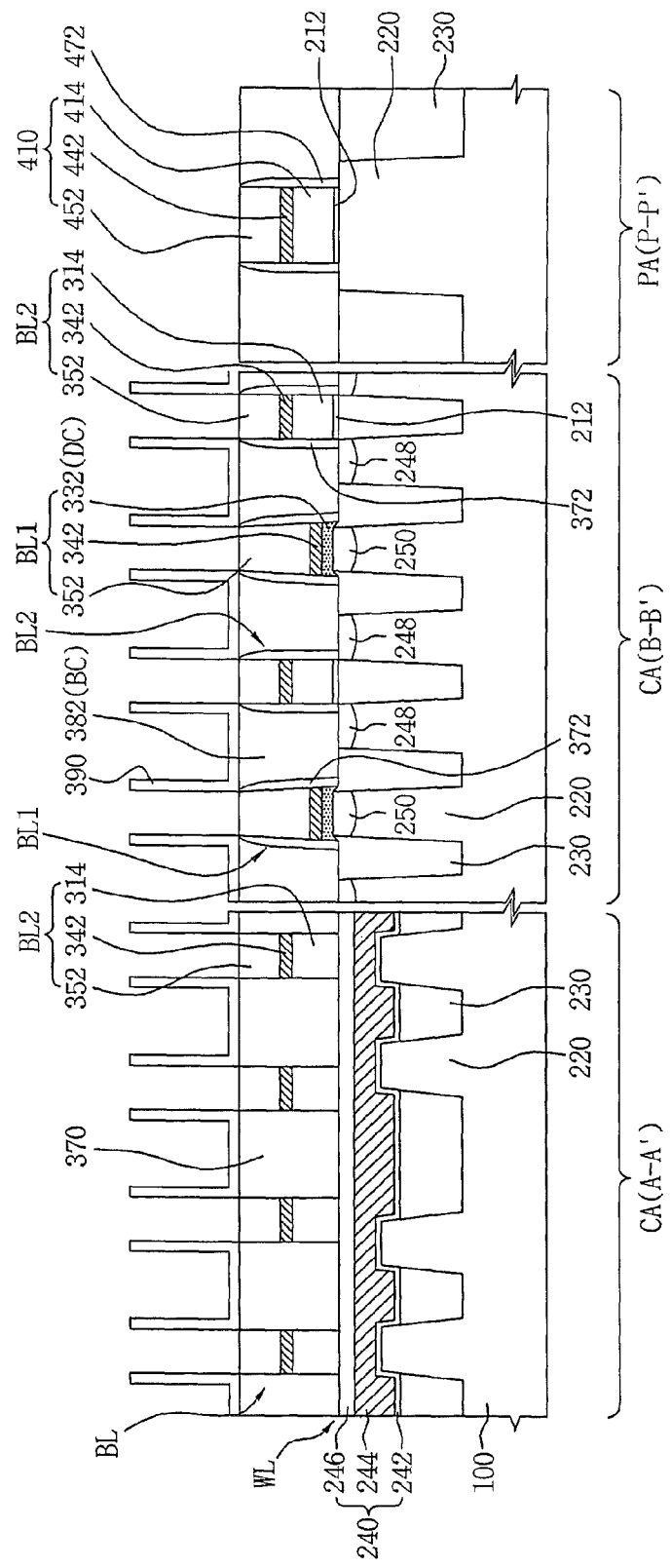
FIG. 2 is a longitudinal sectional view taken along lines A-A', B-B', and P-P' of FIG. 1.
Figure 3:
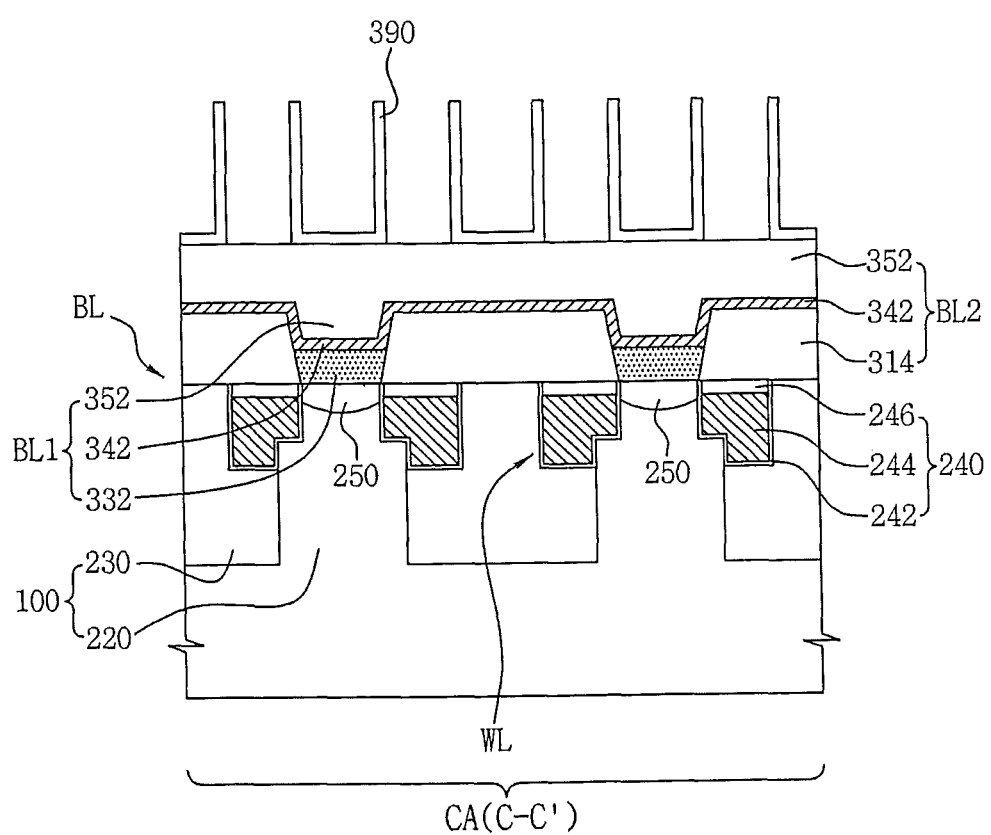
FIG. 3 is a longitudinal sectional view taken along line C-C' of FIG. 1.

FIG. 1 is a plan view of a semiconductor device according to embodiments of the inventive concept. FIG. 2 is a longitudinal sectional view taken along lines A-A', B-B', and P-P' of FIG. 1. FIG. 3 is a longitudinal sectional view taken along line C-C' of FIG. 1. FIGS. 4A through 4G are longitudinal sectional views taken along lines A-A', B-B', and P-P' of FIG. 1, and FIGS. 5A through 5G are longitudinal sectional views taken along line C-C' of FIG. 1, that together illustrate a method of fabricating the semiconductor device of FIGS. 1-3.

Referring to FIGS. 1, 2, and 3, a substrate 100 may include a cell area CA and a peripheral area PA. The cell area CA may include a plurality of cells. Each cell may include a single gate electrode 240 and a single storage electrode 390. The peripheral area PA may include a peripheral gate electrode 410 that functions to read data from the cells and to write data to the cells.

Each of the gate electrodes 240 and 410 may include a planar-type channel formed in a horizontal direction of the substrate 100 (i.e., parallel to a bottom surface of the substrate) or a vertical-type channel formed in a vertical direction to the substrate 100 (i.e., normal to the bottom surface of the substrate). In the depicted embodiment, the gate electrode 410 of the peripheral area PA has a planar-type channel, while the gate electrodes 240 in the cell area CA have a vertical-type channel having an increased length to suppress a short channel effect. In the depicted embodiment, the gate electrodes 240 in the cell area CA are buried electrodes that are buried in the substrate 100.

The gate electrodes 240 in the cell area CA may each include a gate insulating pattern 242, a gate conductive pattern 244, and a gate capping pattern 246, which are sequentially stacked in a trench to form a buried gate in an active region 220.

In the cell area CA, the active regions 220 are defined by isolation regions 230, each of which may be repetitively arranged at predetermined intervals. The active regions 220 may be tilted diagonally with respect to first and second directions of the substrate 100, as shown in FIG. 1. Accordingly, the active regions 220 form oblique angles with both the first and second directions. Word lines WL may extend in the first direction, and bit lines BL may extend in the second direction. The first and second directions may be perpendicular to each other. As shown in FIG. 1, two word lines WL may intersect one bit line BL within one active region 220.

For example, when one active region 220 may have two unit cells, the length of a unit cell measured in the second direction may be 4 F on the basis of the minimum feature, and the length of the unit cell measured in the first direction may be 2 F so that the unit cell can have an area of 6 F2. In the 6 F2 cell structure, the word lines WL and the bit lines BL may intersect at right angles, and the active region 220 that is defined by the isolation region 230 may have a bar shape (see FIG. 1) and may be tilted in diagonal directions with respect to the word lines WL and the bit lines BL to minimize a cell area.

Contacts may be formed that electrically connect a respective one of the storage electrodes 390 and its associated bit line BL to a respective one of the active regions 220. These contacts may comprise a buried contact (hereinafter, storage contact BC) that is formed between the storage electrode 390 and a source region 248 and a direct contact (hereinafter, bit line contact DC) that is formed between the bit line BL and a drain region 250. The storage contacts BC and the bit line contacts DC may be arranged at predetermined intervals between the word lines WL.

In this case, each bit line BL in the cell area CA may include first and second bit line structures BL1 and BL2 which each include third conductive patterns 342 which function as interconnections. The third conductive patterns 342 in the bit line structures BL1 may have different widths and heights than the third conductive patterns 342 in the bit line structures BL2. In particular, the third conductive patterns 342 of the first bit line structures BL1 may be formed in some embodiments to have a greater width than the third conductive patterns 342 of the second bit line structures BL2, such that the third conductive patterns 342 of the first bit line structures BL1 have a tab structure. The third conductive patterns 342 of the first bit line structures BL1 are formed at a lower level (i.e., closer to the bottom surface of the substrate 100) than are the third conductive patterns 342 of the second bit line structures BL2. Thus, the third conductive patterns 342 of the first bit line structures BL1 have a vertical stack down (VSD) structure. In some embodiments, the top surface of the third conductive pattern 342 of the second bit line structure BL2 may be disposed at least twice as far from the top surface of the active region 220 as is the top surface of the third conductive pattern 342 of the first bit line structure BL1. Thus, the third conductive pattern 342 of the first bit line structure may have a half VSD structure.

Each first bit line structure BL1 may include a second conductive pattern 332, the third conductive pattern 342, and a second mask pattern 352, which are sequentially stacked on the active region 220. Each second bit line structure BL2 may include a first conductive pattern 314, the third conductive pattern 342, and the second mask pattern 352, which are sequentially stacked on the isolation region 230. The first bit line structures BL1 may be in contact with respective ones of the drain regions 250. The first and second bit line structures BL1 and BL2 may be integrally connected to each other and may together form a bit line BL that extends in the second direction.

Since the first bit line structure BL1 has a tab structure, a contact area between the third conductive pattern 342 and the bit line contact DC may be increased, and a contact resistance therebetween may be reduced. Since the third conductive pattern 342 of the first bit line structure BL1 is only offset a small distance in the vertical direction from the active region, a distance between the third conductive pattern 342 of the first bit line structure BL1 and the storage contact BC and/or a distance between adjacent third conductive patterns 342 may be increased, thereby reducing a parasitic capacitance of the bit line BL. In particular, since the thickness of spacers 372 decreases with increasing distance from the substrate 100, a distance between the storage contact BC and the third conductive patterns 342 of the first bit line structure BL1 may increase by offsetting the third conductive patterns 342 of the first bit line structures BL1 only a small distance in the vertical direction from the active region.

As shown in FIG. 2, a peripheral gate electrode 410 of the peripheral area PA may include a planar-type channel formed on the substrate 100. The gate electrode 410 of the peripheral area PA may include a peripheral first conductive pattern 414, a peripheral third conductive pattern 442, and a peripheral second mask pattern 452, which are sequentially stacked on the active region 220. As described above, since the half VSD structure is formed only on the cell area CA but not applied to the peripheral area PA, the half VSD structure may not affect the peripheral gate electrode 410 of the peripheral area PA.

Hereinafter, a method of fabricating the semiconductor device having the above-described structure will be described with reference to the attached drawings.

Figure 4A:
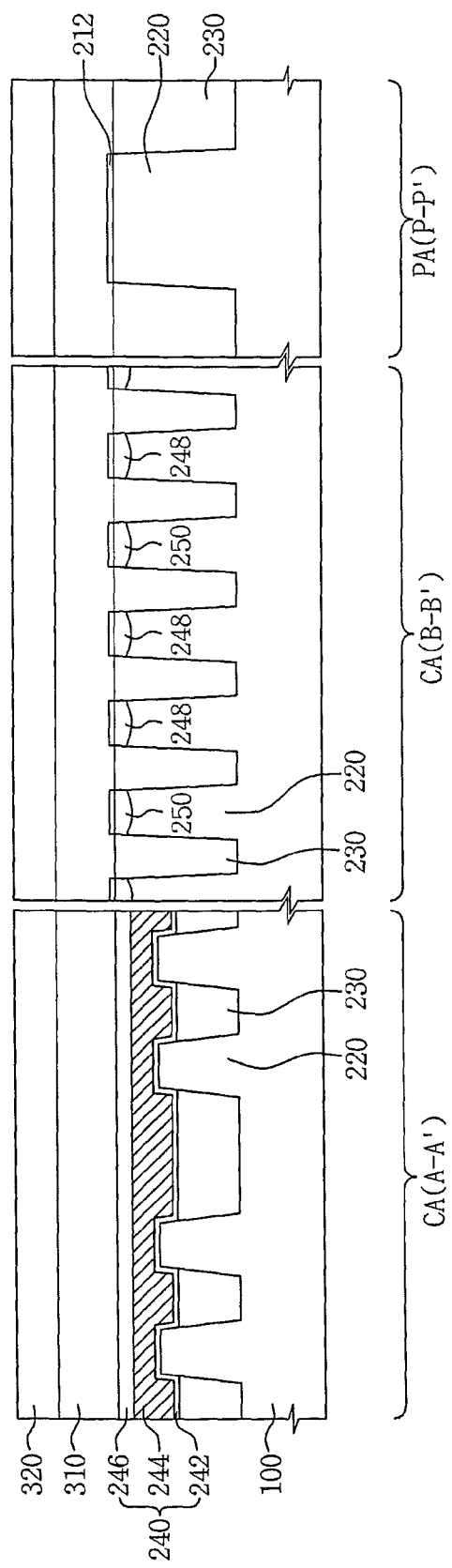
FIGS. 4A through 4G are longitudinal sectional views taken along lines A-A', B-B', and P-P' of FIG. 1 that illustrate a method of fabricating the semiconductor device of FIGS. 1-3.
Figure 5A:
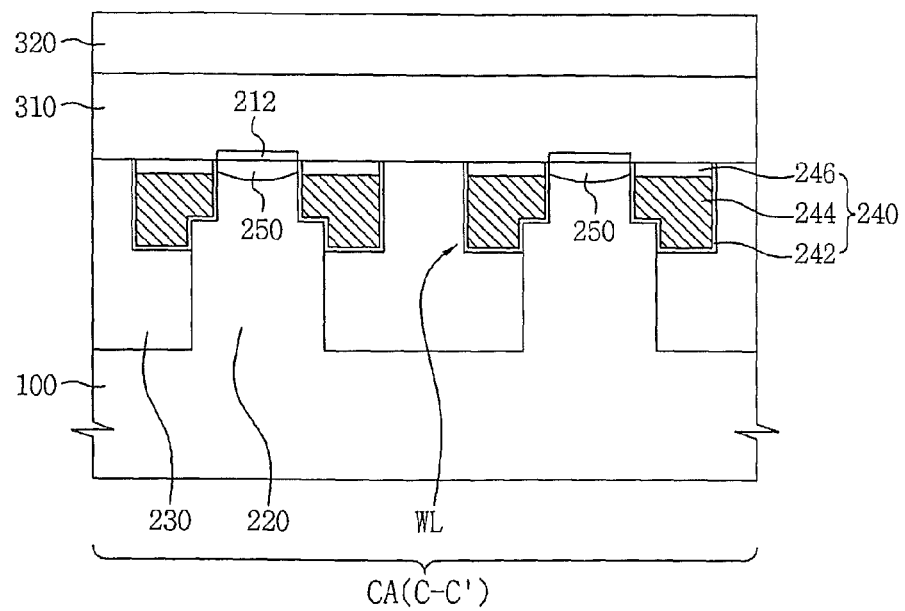
FIGS. 5A through 5G are longitudinal sectional views taken along line C-C' of FIG. 1 that further illustrate the method of fabricating the semiconductor device of FIGS. 1-3.

Referring to FIGS. 1, 4A, and 5A, an isolation process may be performed. In one exemplary isolation process, an isolation trench (not shown) may be formed in the substrate 100. The isolation trench may be filled with an isolation material, thereby forming an isolation region 230. The isolation region 230 may define one or more active regions 220. The substrate 100 may be formed, for example, of single crystalline silicon (Si) or silicon germanium (SiGe). The substrate 100 may comprise a bulk semiconductor substrate, a semiconductor on insulator substrate, a semiconductor epitaxial layer, or any other suitable material in which active regions and isolation regions may be formed. The isolation material may include, for example, borophosphosilicate (BPSG), undoped silicate glass (USG), or a high-density plasma (HDP) oxide. Buffer insulating patterns 212 may then be formed over the active regions 220.

In some embodiments, the isolation region 230 may be formed using a shallow trench isolation (STI) process. The STI process may include forming an isolation trench in the substrate 100 using a plasma etching process and depositing the isolation material in the isolation trench. As shown in FIG. 1, the active region 220 may have a bar-type island shape where the length of the active region is greater than the width thereof. The isolation region 230 may surround the active region 220.

Thereafter, a gate burying process may be performed. Initially, a trench (not shown) for a buried gate may be formed using a recess process. During the recess process, the active region 220 and the isolation region 230 may be selectively removed. A top surface of the isolation region 230 may be at a lower level than a top surface of the active region 220 so that the active region 220 can have a protruding structure.

A gate insulating layer (not shown) may be deposited along a profile of the trench for the buried gate using, for example, a chemical vapor deposition (CVD) process or a thermal oxidation process. A gate conductive layer (not shown) may be formed in the trench on the gate insulating layer using, for example, a physical vapor deposition (PVD) process or a sputtering process to provide the buried gate. The gate insulating layer and the gate conductive layer may be partially removed using, for example, a chemical mechanical polishing (CMP) process or an etchback process, thereby forming a gate insulating pattern 242 and a gate conductive pattern 244. A top surface of the gate conductive pattern 244 may be at a lower level than a top surface of the substrate 100.

A gate capping layer (not shown) may be deposited on the exposed gate conductive pattern 244 to protect the gate conductive pattern 244. The gate capping layer may be partially removed using a CMP process or an etchback process until the top surface of the substrate 100 is exposed, thereby forming a gate capping pattern 246. In some embodiments, the gate insulating layer may be formed of silicon oxide, the gate conductive layer may be formed of a doped poly-Si, a metal, or a metal compound, and the gate capping layer may be formed of silicon oxide. The gate electrode 240 that includes the gate insulating pattern 242, the gate conductive pattern 244, and the gate capping pattern 246 may function as a word line WL.

An ion implantation process may be performed using the gate electrode 240 and the isolation region 220 as an ion implantation mask, thereby forming source and drain regions 248 and 250. As a result, a buried transistor that includes the gate insulating pattern 242, the gate conductive pattern 244, the gate capping pattern 246, and the source and drain regions 248 and 250 may be completed.

Thereafter, a first conductive layer 310 and a first mask layer 320 may be formed on the substrate 100. The first conductive layer 310 and the first mask layer 320 may be sequentially deposited in both the cell area CA and the peripheral area PA of the substrate 100. The first conductive layer 310 may be, for example, a poly-Si layer. The first mask layer 320 may be, for example, a silicon nitride layer. Since the first conductive layer 310 does not serve as a bit line contact DC, the first conductive layer 310 may be replaced in other embodiments with a non-conductive layer (not shown) such as, for example, a silicon oxide layer. However, when the first conductive poly-Si layer 310 is provided, a process of forming a bit line BL in the cell area CA and a process of forming a peripheral gate electrode 410 in the peripheral area PA may be performed at the same time.

Figure 4B:
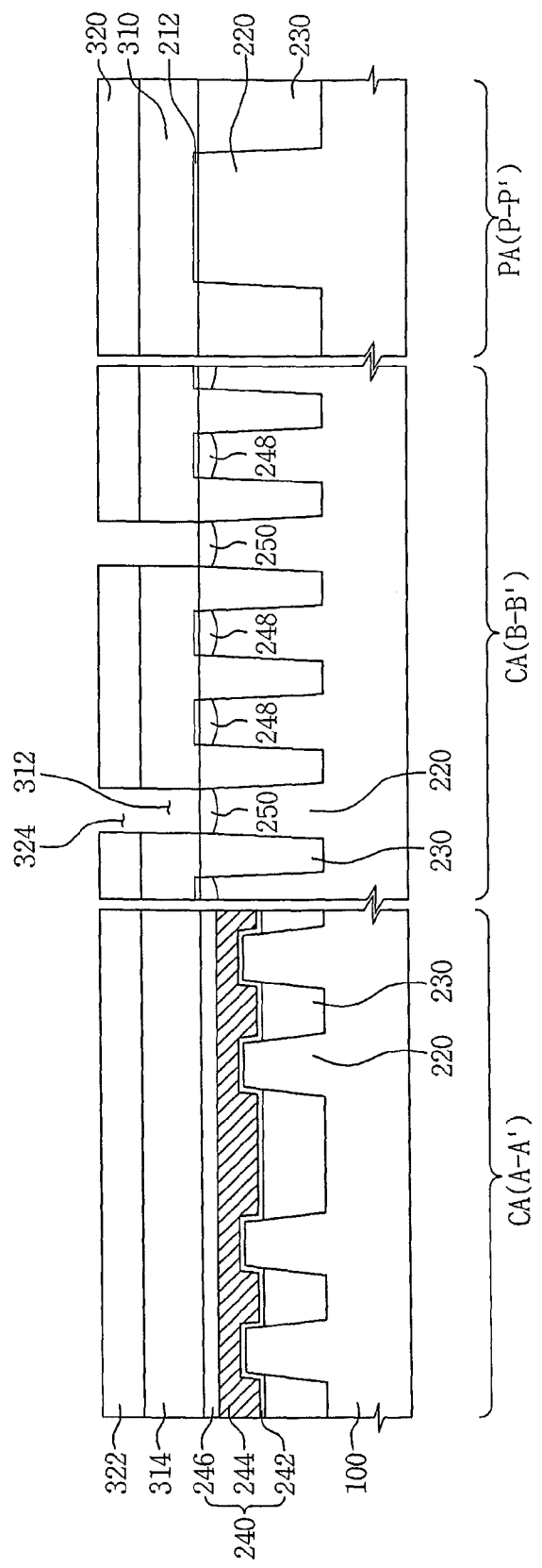
Figure 5B:
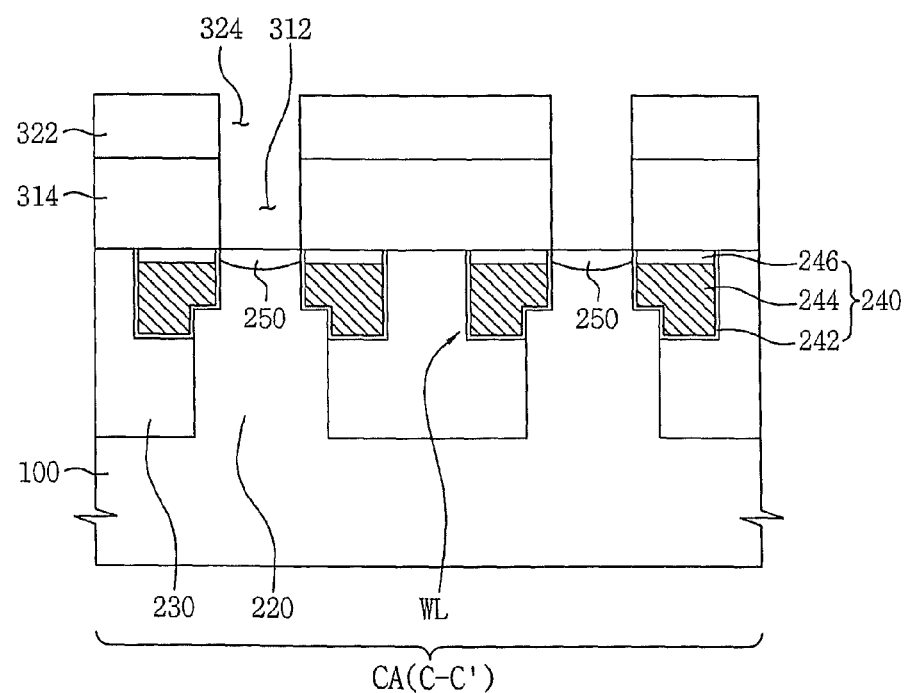

Referring to FIGS. 1, 4B, and 5B, the first conductive layer 310 and the first mask layer 320 may be patterned using a etching process. The first mask layer 320 may be patterned, thereby forming a first mask pattern 322 in the cell area CA. The first mask layer 320 may be patterned using ordinary photolithography and etching processes. The first mask pattern 322 may include a plurality of first mask layer holes 324. The first mask layer 320 of the peripheral area PA may remain unpatterned.

The first conductive layer 310 may be patterned using the first mask pattern 322 as an etch mask. Thus, a first conductive pattern 314 including first conductive layer holes 312 may be formed. The first conductive layer holes 312 may overlap the active region 220. Each of the first conductive layer holes 312 may be formed, for example, as a circular or rectangular hole.

Figure 4C:
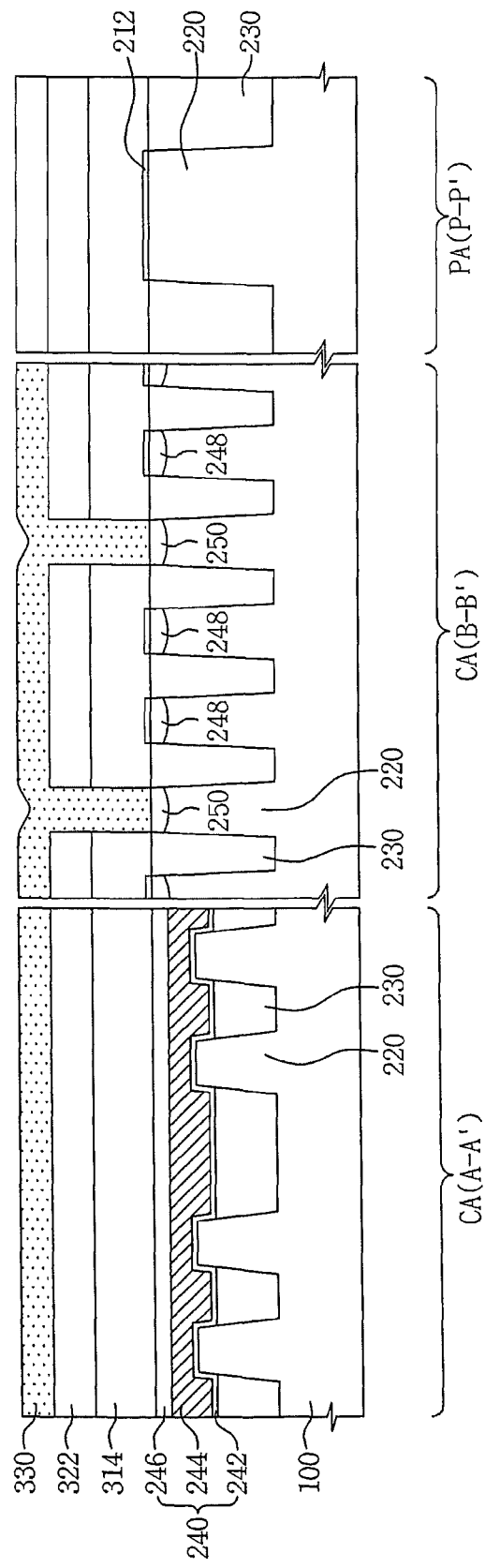
Figure 5C:
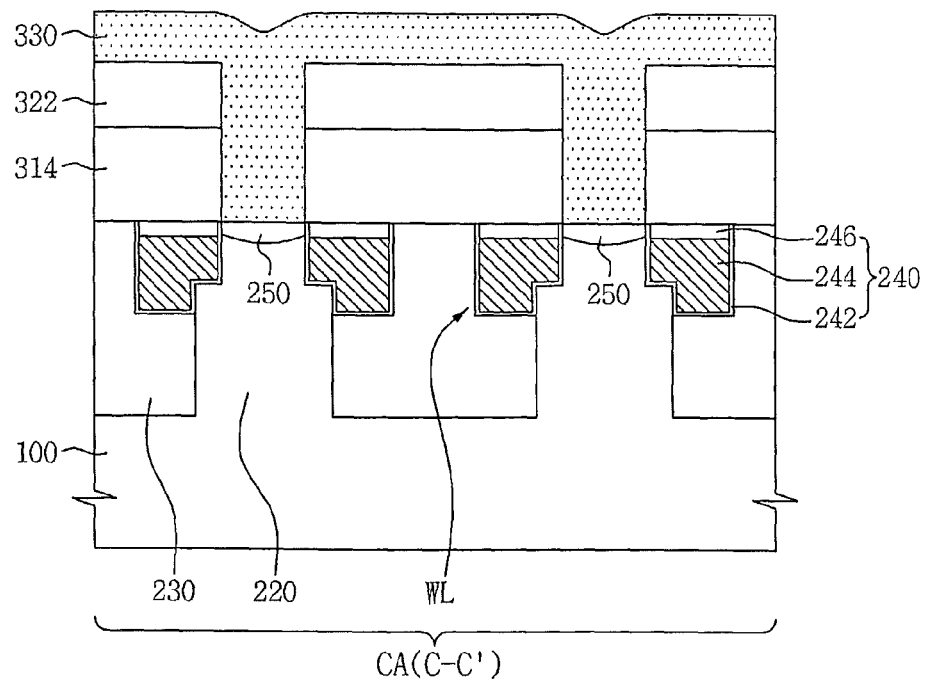

Referring to FIGS. 1, 4C, and 5C, a second conductive layer 330 may be deposited in the first conductive layer holes 312 using, for example, a gap fill process. The second conductive layer 330 may also be formed on the first mask pattern 322. The second conductive layer 330 may be formed of the same material layer as the first conductive layer 310. For example, in some embodiments, the second conductive layer 330 may be formed of a poly-Si layer.

Figure 4D:
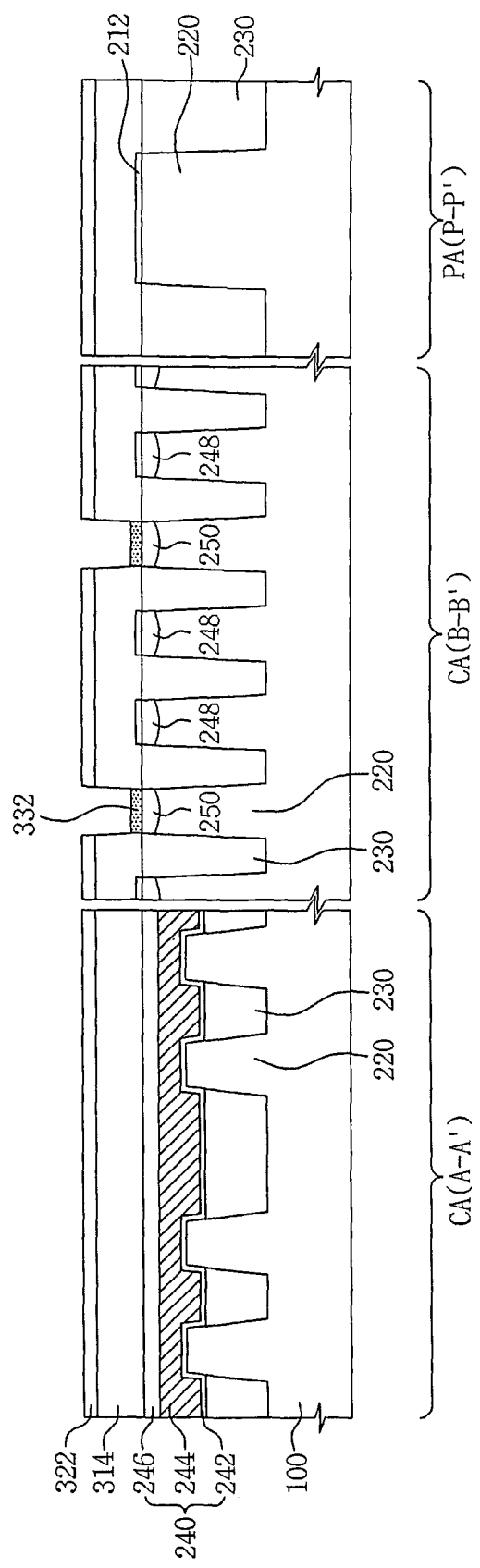
Figure 5D:
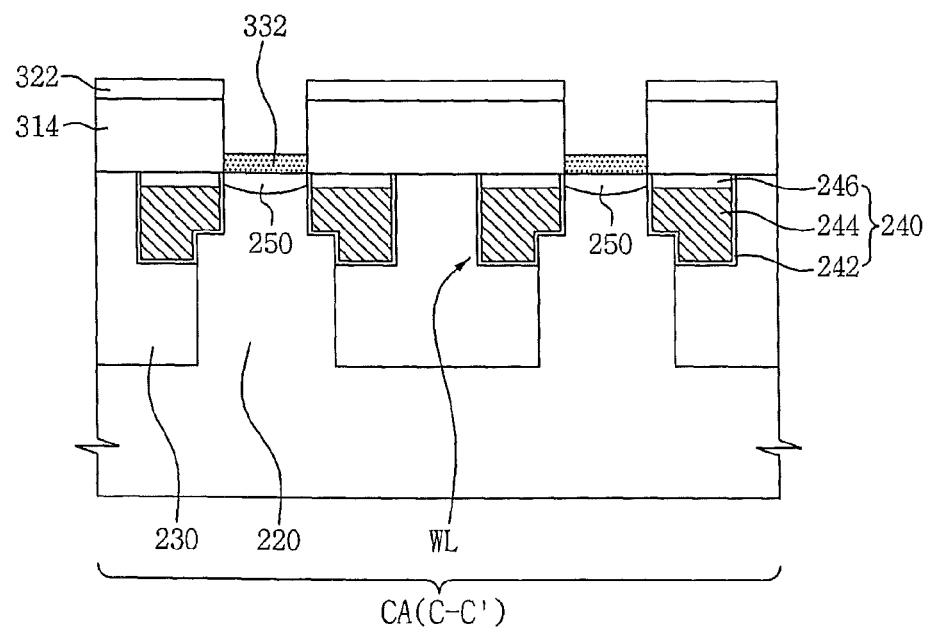

Referring to FIGS. 1, 4D, and 5D, the second conductive layer 330 may be partially removed using an etchback process, thereby forming a second conductive pattern 332 that may fill part of each first conductive layer hole 312. A top surface of the second conductive pattern 332 may be at a lower level than a top surface of the first conductive pattern 314. Thus, there may be a predetermined step difference between the first and second conductive patterns 314 and 332. The first mask pattern 322, which is a sacrificial pattern, may be removed. The second conductive pattern 332 may be used as a bit line contact DC or a contact pad.

Figure 4E:
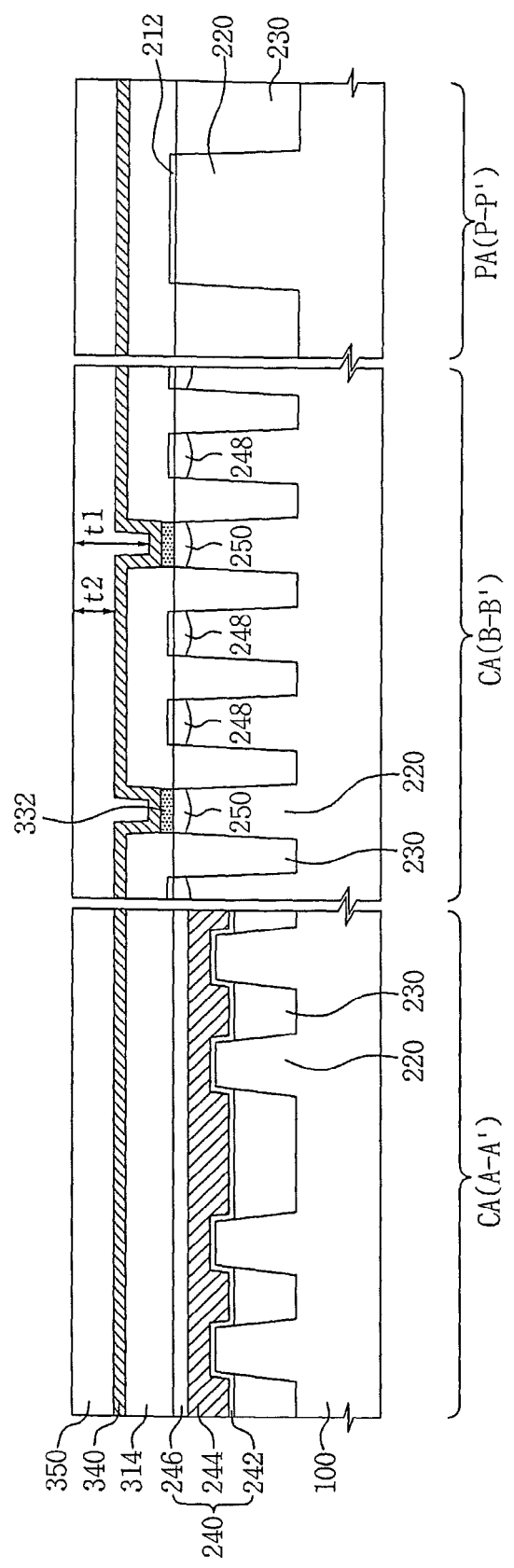
Figure 5E:
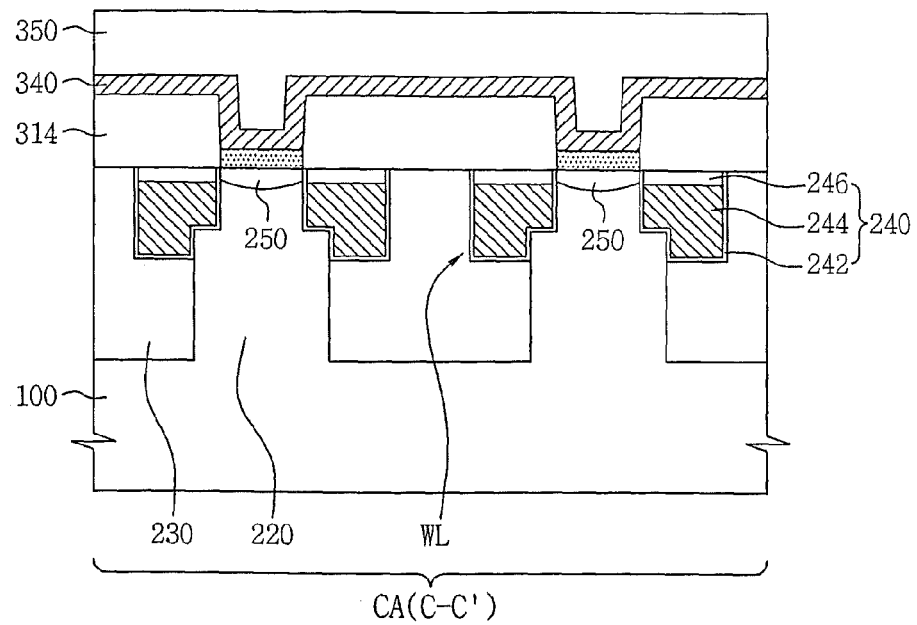

Referring to FIGS. 1, 4E, and 5E, a third conductive layer 340 and a second mask layer 350 may be formed using a deposition process. The third conductive layer 340 may be deposited on the first and second conductive patterns 314 and 332. The second mask layer 350 may be deposited on the third conductive layer 340. Since the third conductive layer 340 is conformally formed on the first and second conductive patterns 314 and 332, a top surface of the portion of the third conductive layer 340 that is formed on the second conductive pattern 332 may be at a lower level than a top surface of the portion of the third conductive layer 340 that is formed on the first conductive pattern 314. Therefore, a thickness t1 of the portion of the second mask layer 350 that overlies the second conductive pattern 332 may be greater than a thickness t2 of the portion of the second mask layer 350 that overlies the first conductive pattern 314.

Figure 4F:
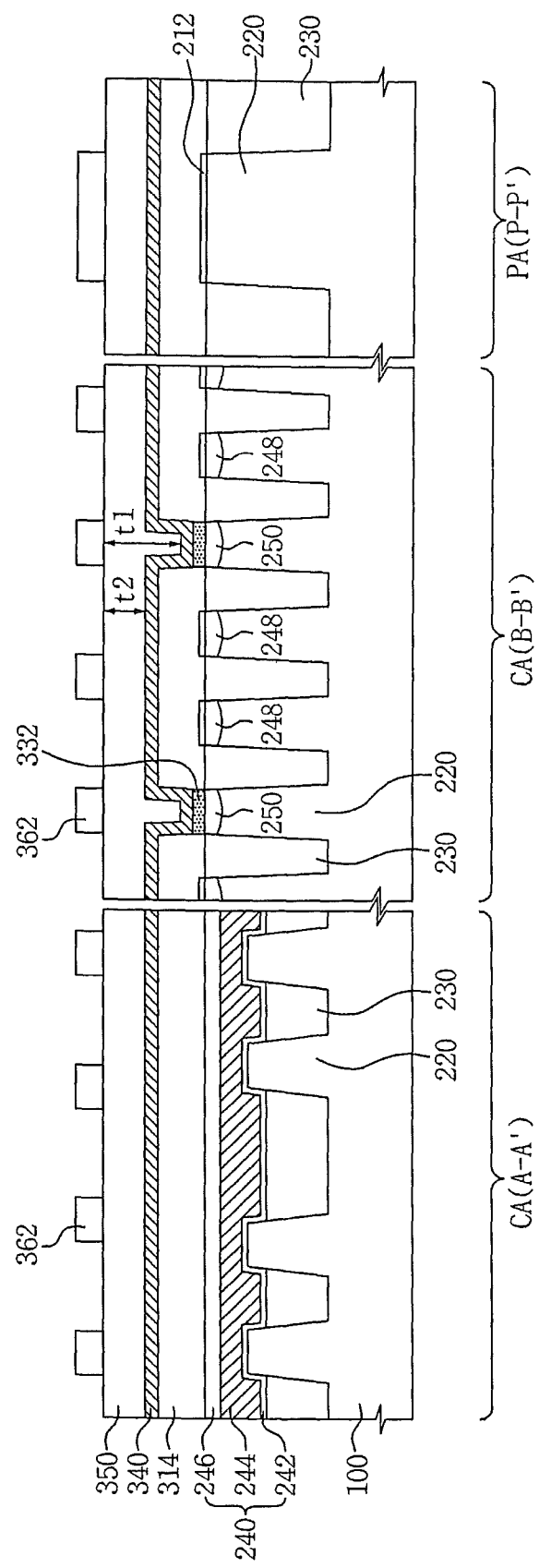
Figure 5F:
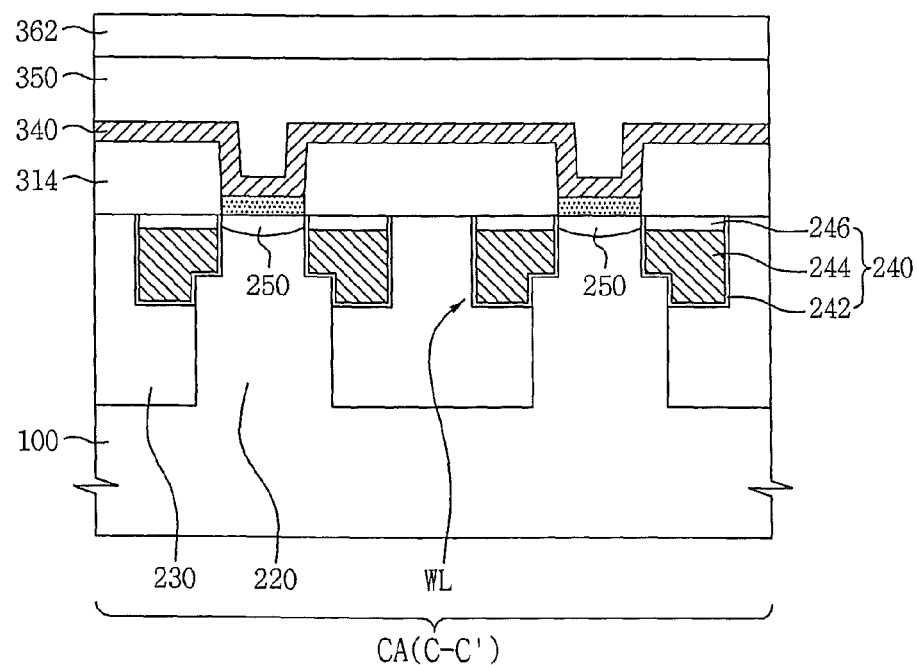

Referring to FIGS. 1, 4F, and 5F, a lithography process may be performed. A photoresist layer (not shown) may be coated on the second mask layer 350, and a photoresist pattern 362 may be formed using a photolithography process. The photoresist patterns 362 formed in the cell area CA may have the same size. However, the photoresist pattern 362 formed in the peripheral area PA may have a greater size than the photoresist patterns 362 that are formed in the cell area CA.

Figure 4G:
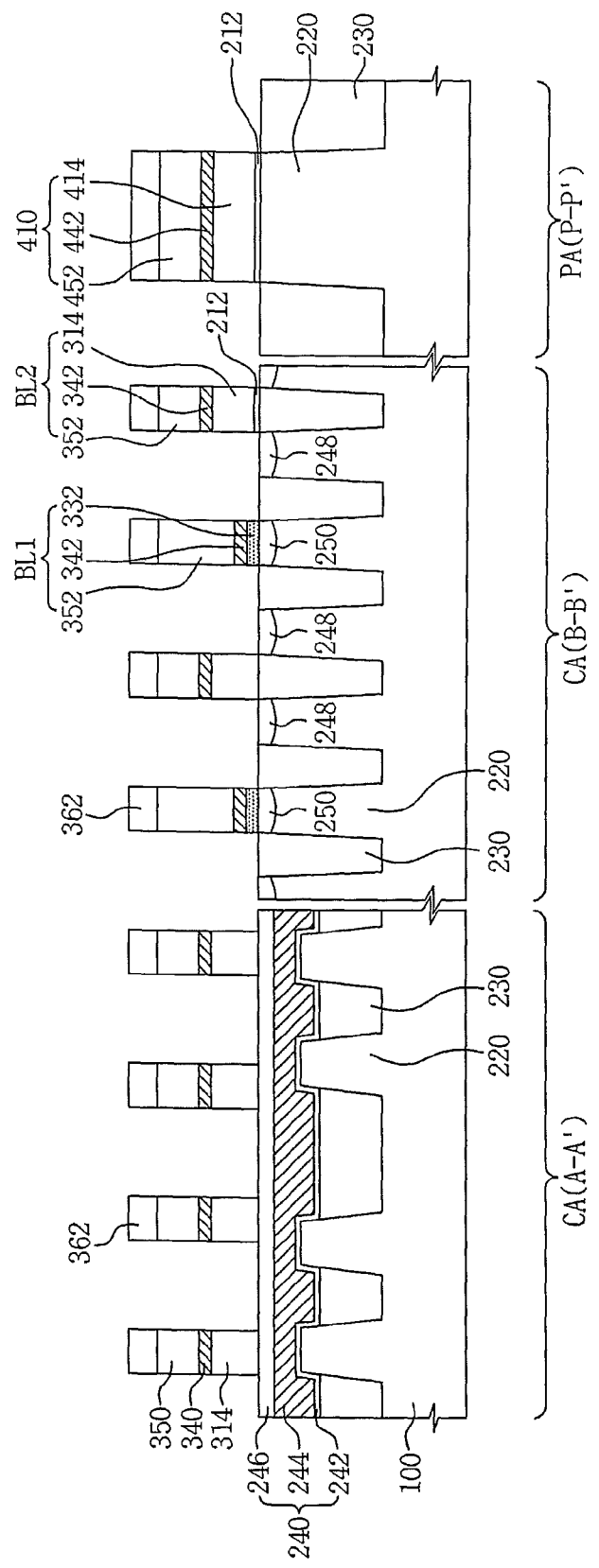
Figure 5G:
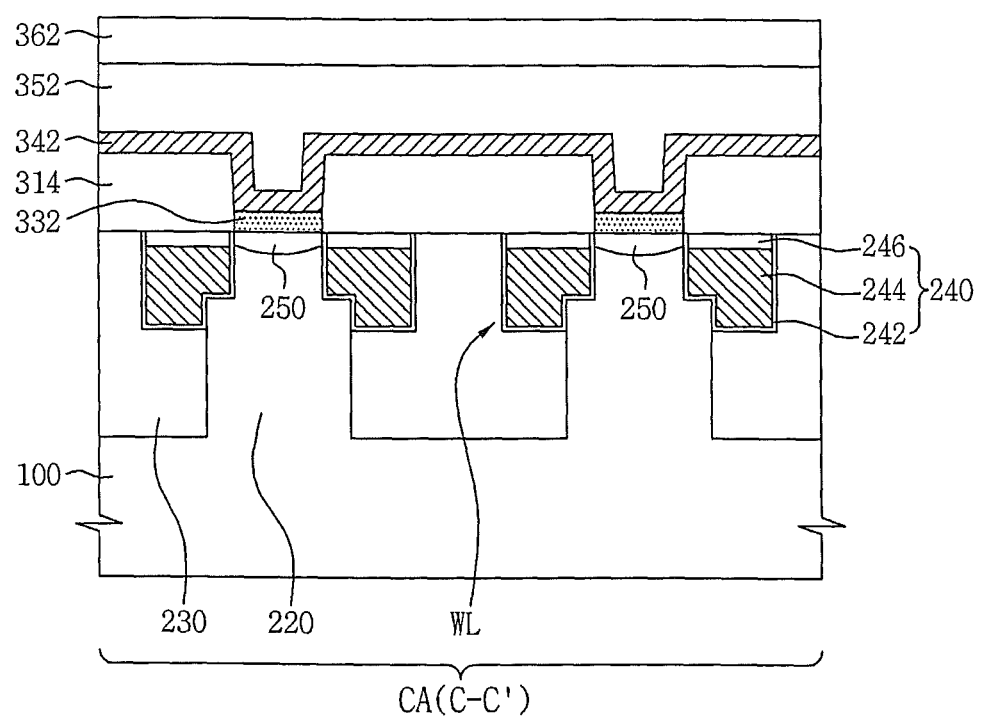

Referring to FIGS. 1, 4G, and 5G, the third conductive layer 340 and the second mask layer 350 may be selectively removed using a bit line process, thereby forming a third conductive pattern 342 and a second mask pattern 352. During the bit line process, the second conductive pattern 332 may be partially removed. This bit line process provides a first bit line structure BL1 and a second bit line structure BL2. The first bit line structure BL1 may include the second conductive pattern 332, the third conductive pattern 342, and the second mask pattern 352, while the second bit line structure BL2 may include the first conductive pattern 314, the third conductive pattern 342, and the second mask pattern 352. The second mask pattern 352 may be used as a bit line capping pattern.

The first and second bit line structures BL1 and BL2 are integrally connected to each other, and together the first and second bit line structures BL1 and BL2 form one bit line BL. The first bit line structure BL1 may overlap the active region 220. Thus, the first bit line structure BL1 may be in contact with the drain region 250 of the active region 220. The second bit line structure BL2 may overlap the isolation region 230. Thus, the second bit line structure BL2 may not be in direct contact with the drain region 250.

The third conductive pattern 342 of the first bit line structure BL1 may have a greater width than that of the second bit line structure BL2. As described above, this is because the second mask layer 350 of the first bit line structure BL1 may be formed to a greater thickness than that of the second mask layer 350 of the second bit line structure BL2. Even if the widths of the portions of the photoresist pattern 362 that are used to form the first and second bit line structures BL1 and BL2 are identical, a difference in the thickness of the second mask layer 350 may lead to a difference in etching margin between the third conductive patterns 342 of the first and second bit line structures BL1 and BL2. As a result, portions of the third conductive pattern 342 that are disposed at a lower level (i.e., the portions that become part of the first bit line structures BL1) may be exposed to the etching process to a smaller extent than the portions of the third conductive pattern 342 that are disposed at a higher level (i.e., the portions that become part of the second bit line structures BL2). Accordingly, the third conductive patterns 342 of the first and second bit line structures BL1 and BL2 may differ in width.

Thus, the first bit line structure BL1 may have a tab structure with a greater width than the second bit line structure BL2. Although the bit line BL is substantially formed as a line, a region of the bit line BL that contacts the active region 220 may have a tab structure with a greater width than the remainder of the bit line BL. In other words, a tab may be formed in a region where the bit line BL contacts the bit line contact DC so that a contact area between the bit line BL and the bit line contact DC may be increased and a contact resistance between the bit line BL and the bit line contact DC may be reduced.

Furthermore, to improve the characteristics of the semiconductor device, reducing a parasitic capacitance may be as important as reducing the contact resistance. A bit line parasitic capacitance may occur between, for example, the bit line BL and the word line WL, between the bit lines BL, and between the bit line BL and the storage electrode 390. When a storage contact BC that is formed using a self-aligned contact (SAC) process is used to connect the storage electrode 390 to the active region 220, the bit line parasitic capacitance may occur mostly between the bit line BL and this storage contact BC.

As described above, by forming a step difference in the third conductive pattern 342, a distance between the third conductive pattern 342 and the storage contact BC may be increased, and the bit line parasitic capacitance may be reduced. In particular, since the height of the third conductive pattern 342 is decreased, a parasitic capacitance between the third conductive pattern 342 and the storage contact BC may be reduced.

Therefore, when the widths of the bit line BL and the bit line contact DC are increased due to the step difference, not only the contact resistance between the bit line BL and the bit line contact DC but also the parasitic capacitance between the bit line BL and the storage contact BC may be reduced. Also, by forming the step difference and increasing the width of the bit line BL, leaning may be prevented. The term "leaning" refers to a phenomenon in which patterns have a straight structure with a smaller width and collapse or lean.

In the peripheral area PA, the first conductive layer 310, the third conductive layer 340, and the second mask layer 350 may be patterned, thereby forming a peripheral gate electrode 410 on the active region 220. As shown in FIG. 3, the peripheral gate electrode 410 may include a peripheral first conductive pattern 414, a peripheral third conductive pattern 442, and a peripheral second mask pattern 452, which are sequentially stacked.

Referring back to FIGS. 1, 2, and 3, an interlayer insulating layer (not shown) may be formed on the first and second bit line structures BL1 and BL2. This interlayer insulating layer may then be partially removed to form spacers 372 on both sides of the first and second bit line structures BL1 and BL2. The spacers 372 may be formed of silicon oxide. A contact hole (not shown) configured to form a storage contact BC may be formed in the interlayer insulating layer. The contact hole may be filled with a fourth conductive layer (not shown), and a planarization process may be performed on the resultant structure, thereby forming a fourth conductive pattern 382. The fourth conductive pattern 382 may be used as a storage contact BC or a contact pad. Peripheral spacers 472 may also be formed in the peripheral area PA.

Finally, a cylindrical storage electrode 390 may be formed on each storage contact BC in the cell area CA.

FIGS. 6, 7A through 7E, and 8A through 8E are a plan view and longitudinal sectional views that illustrate a method of fabricating a semiconductor device according to various embodiments of the inventive concept.

Figure 6:
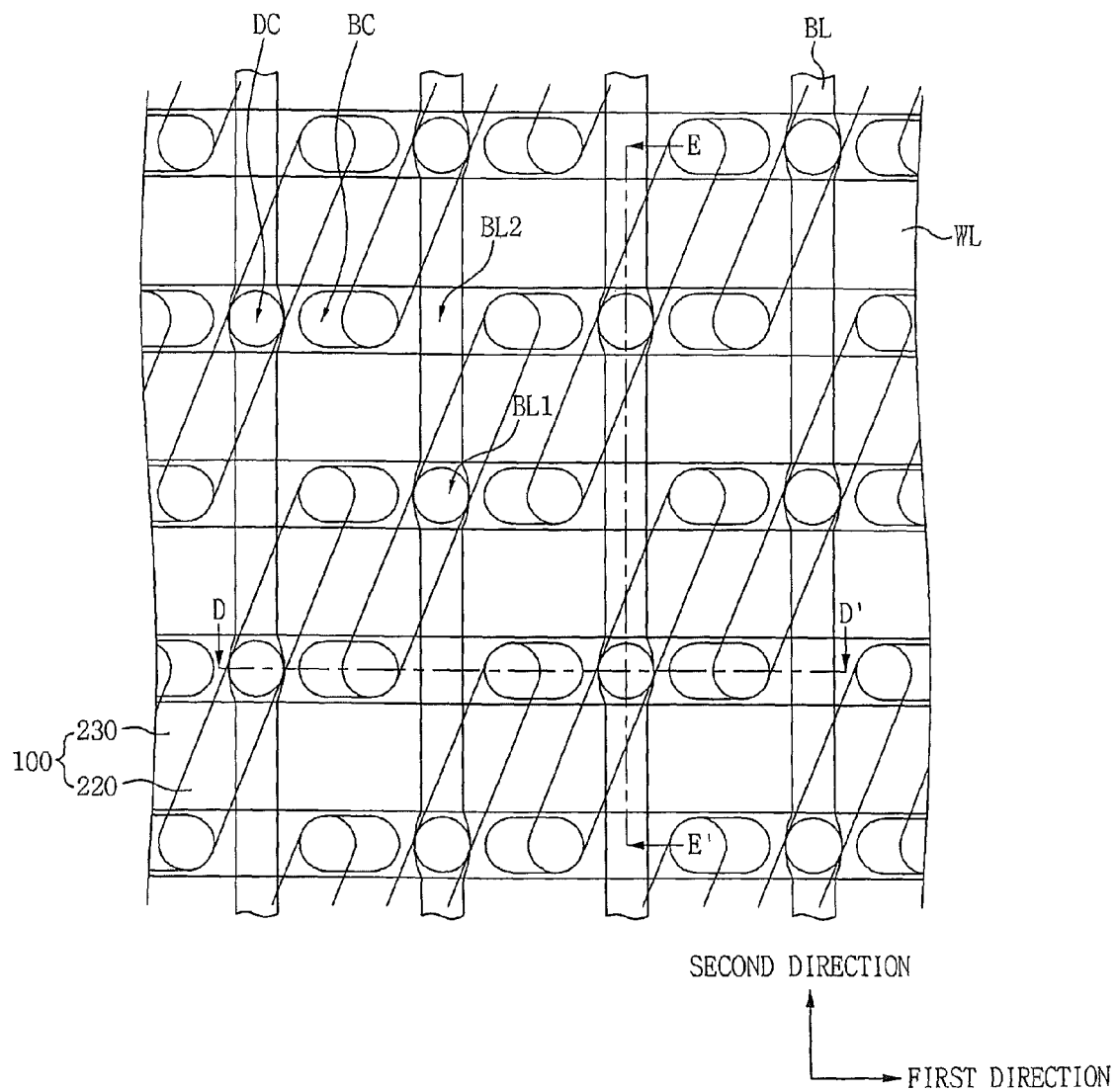
FIG. 6 is a plan view of a semiconductor device according to further embodiments of the inventive concept.
Figure 7A:
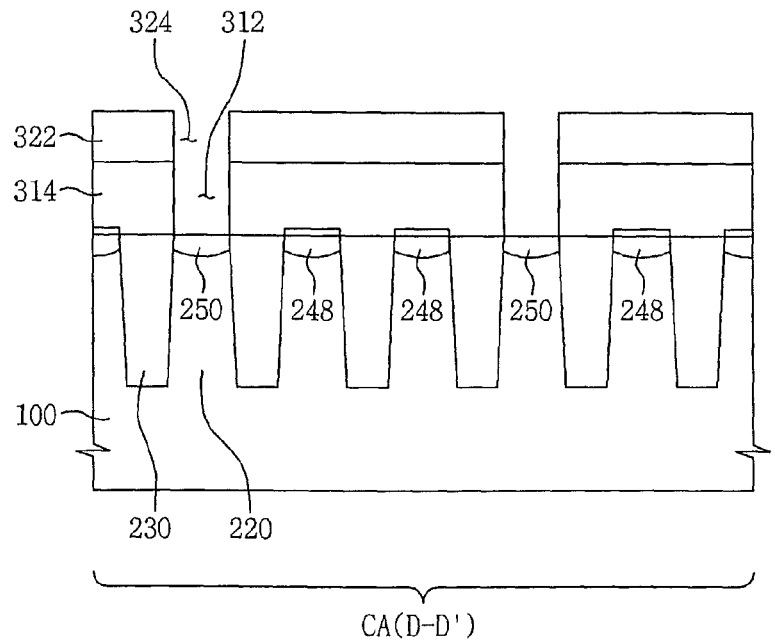
FIGS. 7A through 7E are longitudinal sectional views taken along line D-D' of FIG. 6 that illustrate a method of fabricating the semiconductor device of FIG. 6.
Figure 8A:
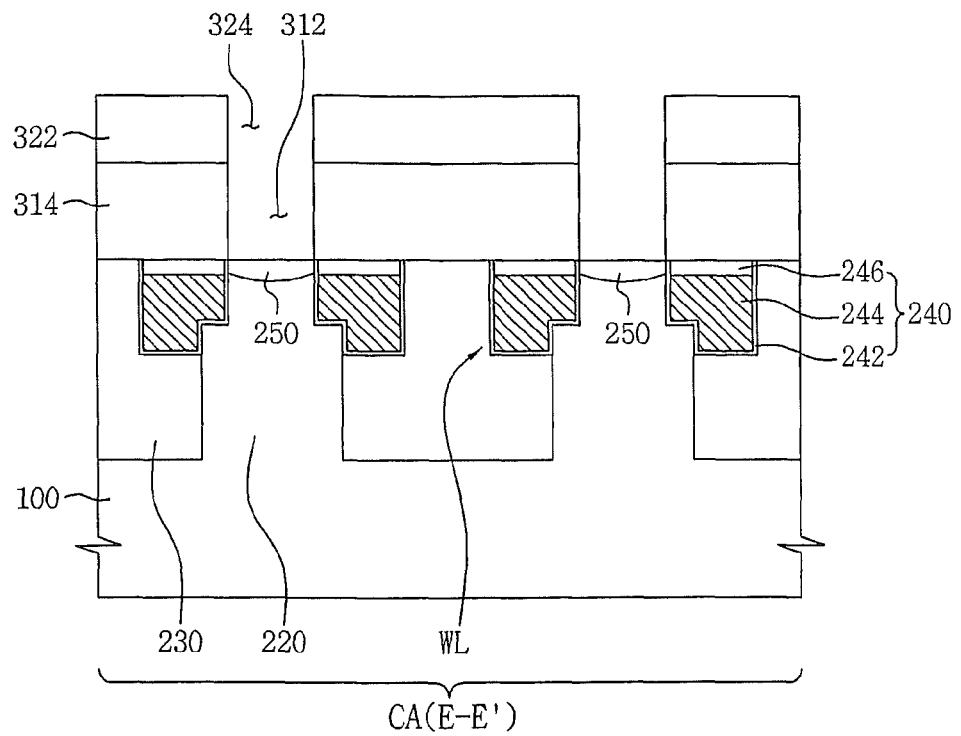
FIGS. 8A through 8E are longitudinal sectional views taken along line E-E' of FIG. 6 that further illustrate the method of fabricating the semiconductor device of FIG. 6.

Referring to FIGS. 6, 7A, and 8A, as in the previous embodiments of the inventive concept, an active region 220 may be formed in a substrate 100 using an isolation process, and a buried gate electrode 240 may be formed using a gate burying process. Also, as in the previous embodiments of the inventive concept, a first conductive layer (not shown) and a first mask layer (not shown) may be sequentially deposited on the substrate 100 and patterned, thereby forming a first mask pattern 322 having a first mask layer hole 324 and a first conductive pattern 314 having a first conductive layer hole 312, which are vertically disposed.

Figure 7B:
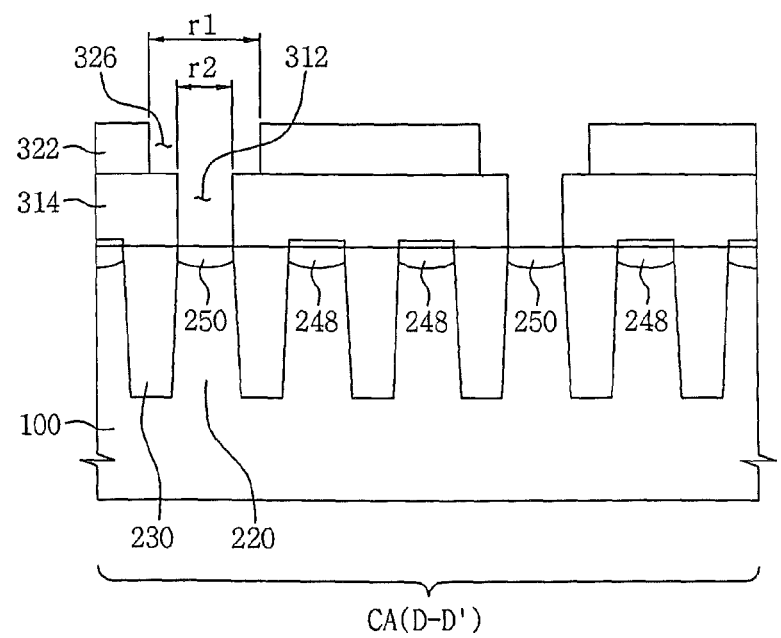
Figure 8B:
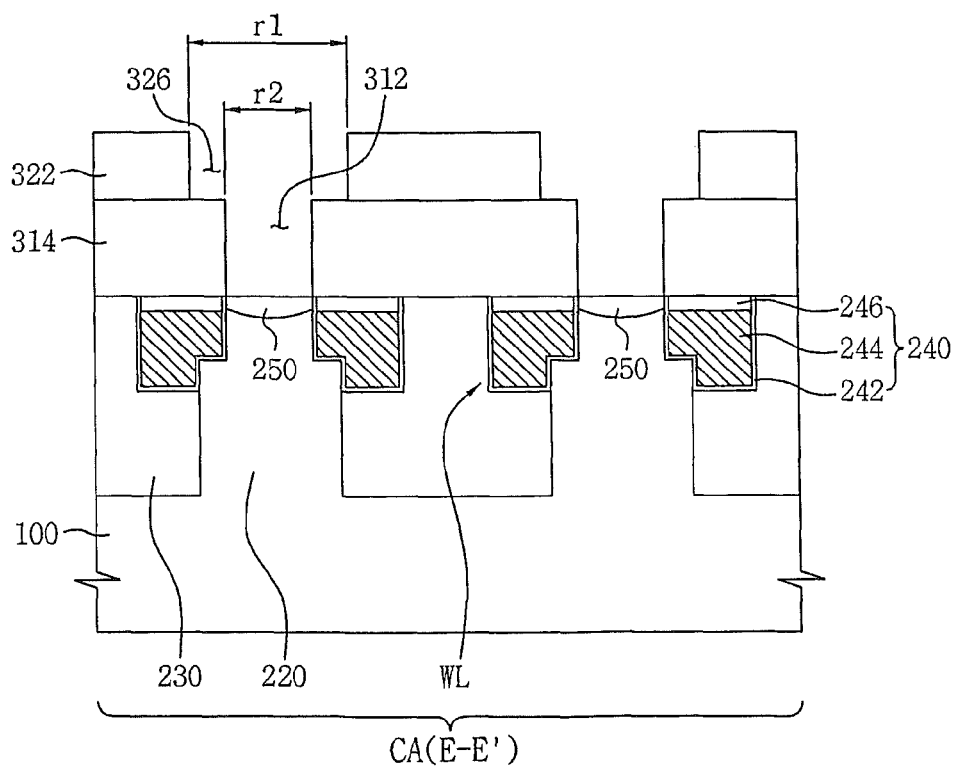

Referring to FIGS. 6, 7B, and 8B, a diameter r1 of the first mask hole 324 may be increased using photolithography and etching processes, thereby forming a first mask expansion hole 326. Thus, the diameter r1 of the first mask expansion hole 326 may be greater than a diameter r2 of the first conductive layer hole 312. It will be appreciated that the first mask expansion hole 326 and the first conductive layer hole 312 need not have circular cross-sections. For example, these holes may alternatively have square cross-sections. Regardless of the shape of the holes, the cross-sectional area of the first mask expansion hole 326 in a cross-section that is parallel to the bottom surface of the substrate 100 may be greater than the cross-sectional area of the first conductive layer hole 312 in the cross-section that is parallel to the bottom surface of the substrate 100.

Figure 7C:
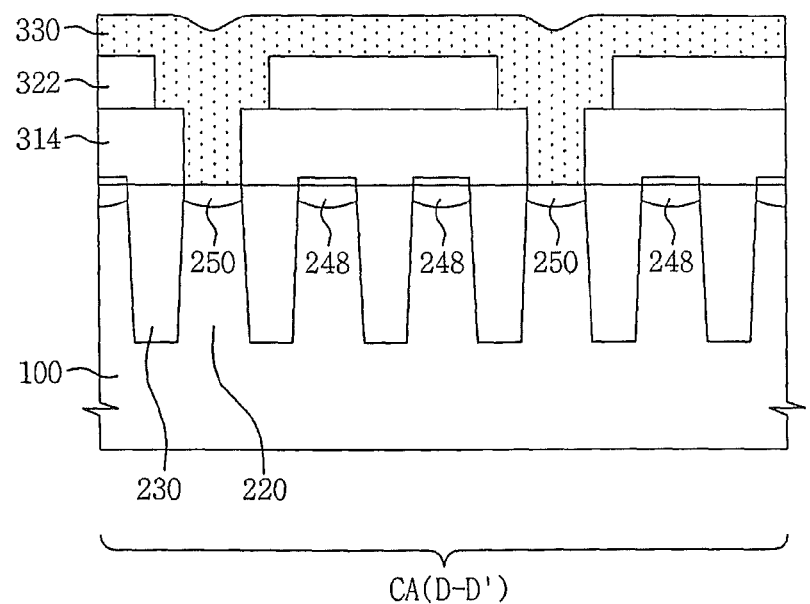
Figure 8C:
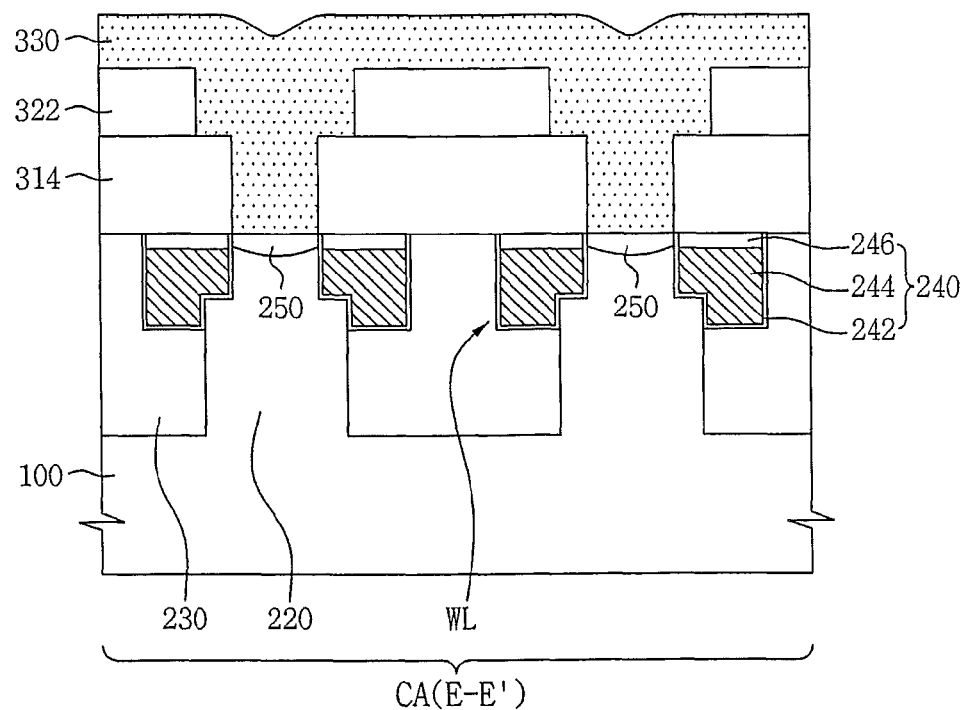

Referring to FIGS. 6, 7C, and 8C, the first conductive layer holes 312 and the first mask expansion holes 326 may be filled with a second conductive layer 330 using a gap filling process.

Figure 7D:
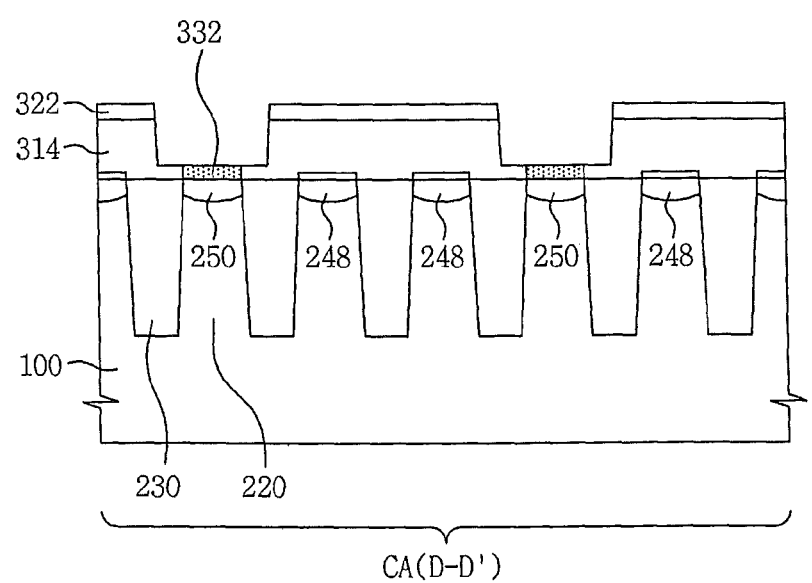
Figure 8D:
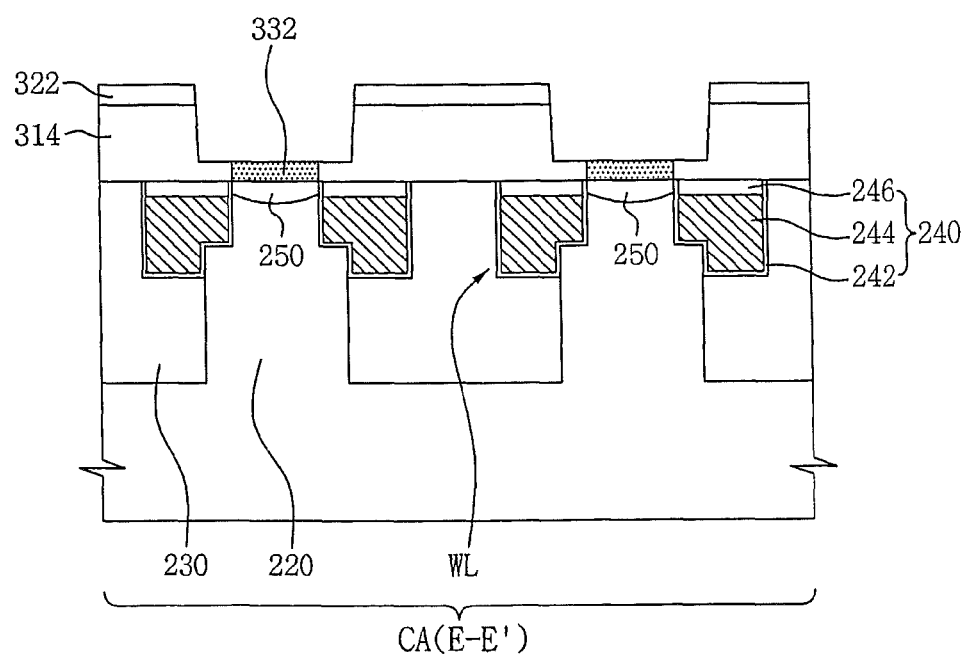

Referring to FIGS. 6, 7D, and 8D, the second conductive layer 330 may be partially removed using an etchback process. In this case, a portion of the first conductive pattern 314 that is exposed by the first mask expansion hole 326 may also be removed during this etchback process. A top surface of the second conductive pattern 332 remaining in the first conductive layer hole 312 may be at substantially the same level as a top surface of the first conductive pattern 314 that remains in the first mask expansion hole 326. The top surface of the second conductive pattern 332 may be at a lower level than the top surface of those portions of the first conductive pattern 314 which are not exposed by the first mask expansion hole 326. Thus, a predetermined step difference may be provided between the second conductive pattern 332 and the unexposed portions of the first conductive pattern 314. The first mask patterns 322 may be removed.

Figure 7E:
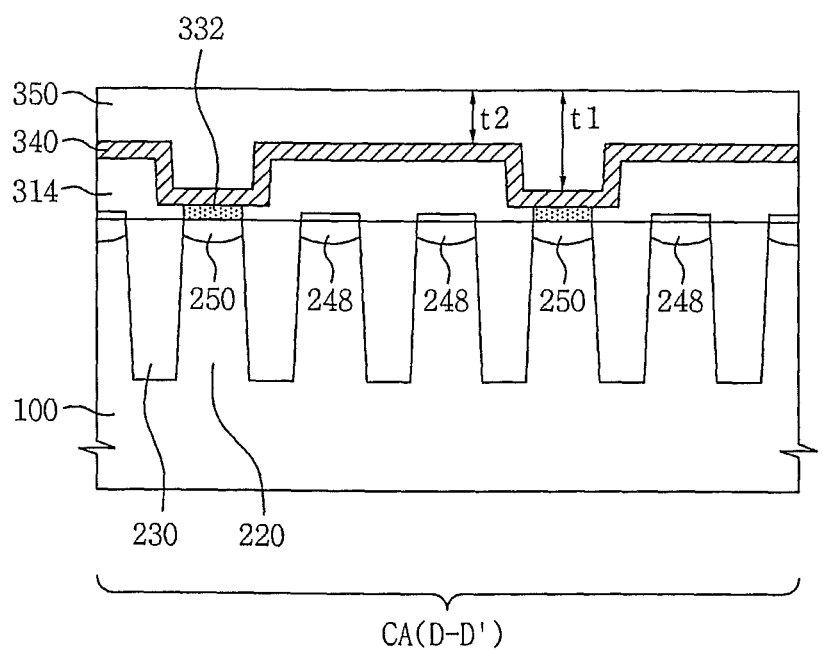
Figure 8E:
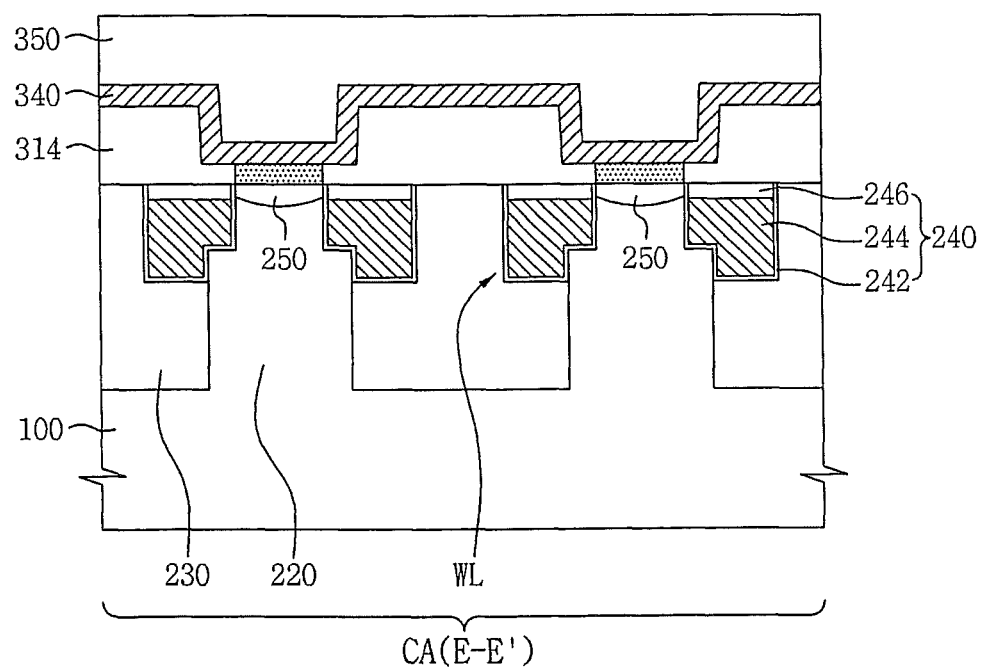

Referring to FIGS. 6, 7E, and 8E, a third conductive layer 340 may be formed on the first conductive pattern 314 and the second conductive pattern 332. A second mask layer 350 may be formed on the third conductive layer 340. In this case, since the third conductive layer 340 is conformally formed on the first and second conductive patterns 314 and 332, a top surface of those portions of the third conductive layer 340 that are formed on the second conductive pattern 332 and the exposed portion of the first conductive pattern 314 may be at a lower level than a top surface of those portions of the third conductive layer 340 that are formed on the unexposed portion of the first conductive pattern 314. Thus, a thickness t1 of those portions of the second mask layer 350 that are on the second conductive pattern 332 and the exposed portion of the first conductive pattern 314 may be greater than a thickness t2 of those portions of the second mask layer 350 that are on the unexposed portion of the first conductive pattern 314.

The structure of FIGS. 7E and 8E may then be processed in the same manner as the structure of FIGS. 4F and 5F and 4G and 5G to form a third conductive pattern (not shown) on the second conductive pattern 332. The top surface of the portions of the third conductive pattern that are formed on the unexposed first conductive pattern 314 may be at a height from the top surface of the substrate 100 that is at least twice the height of the top surface of the portions of the third conductive pattern that are formed on the second conductive pattern 332 is above the top surface of the substrate 100 and/or is at least twice the height that the top surface of the partially removed portion of the first conductive pattern 314 is above the top surface of the substrate 100. Since the portions of the third conductive pattern that are disposed at the lower level have a greater sectional area than the second conductive pattern 332, both the contact resistance and the parasitic capacitance may be reduced.

In addition, the names and functions of unshown components may be easily understood with reference to other drawings of the present specification and descriptions thereof.

As explained above, a method of fabricating a semiconductor device may have the following effects.

First, although a bit line is substantially formed as a line type, since a first bit line structure has a tab structure with a greater sectional area than a second bit line structure, leaning can be reduced and/or prevented in the first bit line structure.

Second, the first bit line structure has a tab structure with a greater width than the second bit line structure so that a contact area between a bit line interconnection and a bit line contact can be increased and a contact resistance therebetween can be reduced.

Third, a top surface of the bit line interconnection of the first bit line structure may be at a lower level than a top surface of the bit line interconnection of the second bit line structure so that a parasitic capacitance between the bit line and/or bit line contact and a storage contact can be reduced.

Fourth, since a photoresist pattern with the same width is used to form first and second bit line structures that have different widths, patterning can be facilitated and a photolithography margin can be improved.

Fifth, the first bit line structure of a cell area and a peripheral gate electrode of a peripheral area can be formed of the same material layer using the same process, so that the process can be simplified.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
   a substrate including a cell area comprising a cell active region and a cell isolation region;
   a cell gate electrode buried in the substrate and crossing the cell active region;
   a drain region in the cell active region adjacent the cell gate electrode;
   an insulation layer on the substrate, the insulation layer having a contact hole exposing the drain region;
   a bit line contact in the contact hole; and
   a bit line,
   wherein the bit line comprises a first bit line portion on the bit line contact and a second bit line portion on the insulation layer, and a top surface of the first bit line portion is lower than a top portion of the second bit line portion.

2. The semiconductor device of claim 1, wherein the first bit line portion is wider in width than the second bit line portion.

3. The semiconductor device of claim 1, wherein the bit line contact is recessed from the insulation layer.

4. The semiconductor device of claim 1, wherein the insulation layer is disposed between the cell isolation region and the bit line in the cell area.

5. The semiconductor device of claim 1, wherein the bit line contact comprises a poly-silicon layer and the bit line comprises a conductive layer.

6. The semiconductor device of claim 1, further comprising:
a first bit line mask pattern on the first bit line portion; and
a second bit line mask pattern on the second bit line portion,
wherein the first bit line mask pattern is thicker than the second bit line mask pattern.

7. The semiconductor device of claim 6, further comprising first spacers covering sidewalls of the first bit line portion and the first bit line mask pattern and second spacers covering sidewalls of the second bit line portion and the second bit line mask pattern.

8. The semiconductor device of claim 1, further comprising cell insulating spacers covering both sides of the bit line contact.

9. The semiconductor device of claim 1 further comprising:
a peripheral active region and a peripheral isolation region in a peripheral area; and
a peripheral gate electrode on the peripheral active region;
wherein the peripheral gate electrode comprises:
a peripheral lower conductive pattern;
a peripheral upper conductive pattern on the peripheral lower conductive pattern; and
a peripheral mask pattern on the peripheral upper conductive pattern;
wherein the peripheral upper conductive pattern and the second cell bit line potion are formed at a same level.

10. The semiconductor device of claim 9, further comprising:
a first bit line mask pattern on the first bit line portion; and
a second bit line mask pattern on the second bit line portion,
wherein the peripheral mask pattern, the first bit line mask pattern and the second bit line mask pattern are formed at a same level.

11. A semiconductor device comprising:
a substrate including a cell area comprising a cell active region and a cell isolation region;
a cell gate electrode buried in the substrate and crossing the cell active region;
a drain region in the cell active region adjacent the cell gate electrode;
an insulation layer on the substrate, the insulation layer having a contact hole exposing the drain region;
a bit line contact in the contact hole;
a first bit line on the bit line contact and a second bit line on the insulation layer; and
a first bit line mask pattern on the first bit line and a second bit line mask pattern on the second bit line,
wherein a top surface of the first bit line is lower than a top surface of the second bit line and the first bit line mask pattern is thicker than the second bit line mask pattern, and
wherein a first thickness of the first bit line is the same as a second thickness of the second bit line.

12. The semiconductor device of claim 11, wherein the first bit line is wider in width than the second bit line.

13. The semiconductor device of claim 11, wherein the insulation layer is disposed between the cell isolation region and the first bit line in the cell area.

14. The semiconductor device of claim 11, wherein the bit line contact comprises a poly-silicon layer and the first and second bit lines comprise a conductive layer.

15. The semiconductor device of claim 11, further comprising cell insulating spacers covering both sides of the bit line contact.

16. The semiconductor device of claim 11, further comprising:
a first bit line mask pattern on the first bit line;
a second bit line mask pattern on the second bit line, wherein the first bit line mask pattern is thicker than the second bit line mask pattern;
first spacers covering sidewalls of the first bit line and the first bit line mask pattern; and
second spacers covering sidewalls of the second bit line and the second bit line mask pattern.

17. The semiconductor device of claim 11, further comprising:
a peripheral active region and a peripheral isolation region in a peripheral area;
a buffer insulating pattern on the peripheral active region;
a peripheral lower conductive pattern on the buffer insulating pattern,
a peripheral upper conductive pattern on the peripheral lower conductive pattern;
a peripheral mask pattern on the peripheral upper conductive pattern; and
a peripheral spacer on sidewalls of the buffer insulating pattern, the peripheral lower conductive pattern, the peripheral upper conductive pattern, and the peripheral mask pattern.

18. A semiconductor device comprising:
a substrate including a cell area comprising a cell active region and a cell isolation region;
a cell gate electrode buried in the substrate and crossing the cell active region;
a drain region in the cell active region adjacent the cell gate electrode;
an insulation layer on the substrate, the insulation layer having a contact hole exposing the drain region;
a bit line contact in the contact hole; and
a bit line,
wherein the bit line comprises a first bit line portion on the bit line contact and a second bit line portion on the insulation layer, and a top surface of the first bit line portion is lower than a top portion of the second bit line portion, and
wherein a first thickness of the first bit line portion is the same as a second thickness of the second bit line portion.

* * * * *